(12) United States Patent
SeyedzadehDelcheh et al.

(10) Patent No.: US 11,416,323 B2
(45) Date of Patent: Aug. 16, 2022

(54) DEFENSE MECHANISM FOR NON-VOLATILE MEMORY BASED MAIN MEMORY

(71) Applicant: Advanced Micro Devices, Inc., Santa Clara, CA (US)

(72) Inventors: Seyedmohammad SeyedzadehDelcheh, Bellevue, WA (US); Steven Raasch, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 36 days.

(21) Appl. No.: 16/723,855

(22) Filed: Dec. 20, 2019

(65) Prior Publication Data

US 2021/0191797 A1     Jun. 24, 2021

(51) Int. Cl.
| | |
|---|---|
| G06F 11/00 | (2006.01) |
| G06F 11/07 | (2006.01) |
| G06F 11/10 | (2006.01) |
| G11C 11/409 | (2006.01) |
| G06F 13/16 | (2006.01) |
| G06F 9/30 | (2018.01) |

(52) U.S. Cl.
CPC ........ *G06F 11/076* (2013.01); *G06F 9/30101* (2013.01); *G06F 11/1044* (2013.01); *G06F 13/1668* (2013.01); *G11C 11/409* (2013.01)

(58) Field of Classification Search
CPC . G06F 11/076; G06F 11/1044; G11C 11/409
See application file for complete search history.

(56) References Cited

U.S. PATENT DOCUMENTS

| | | | | |
|---|---|---|---|---|
| 9,583,189 B2* | 2/2017 | Yoon | ................... | G11C 11/5664 |
| 2004/0202017 A1* | 10/2004 | Lee | ...................... | G11C 13/004 |
| | | | | 365/163 |
| 2013/0013860 A1* | 1/2013 | Franceschini | ........... | G06F 12/00 |
| | | | | 711/118 |
| 2013/0227361 A1* | 8/2013 | Bowers | .................. | G11C 29/76 |
| | | | | 714/710 |

OTHER PUBLICATIONS

J. Choi, et al, "DC-PCM: Mitigating PCM Write Disturbance with Low Performance Overhead by Using Detection Cells," in TC 2019.
L. Jiang, et al "Improving write operations in MLC phase change memory." In HPCA 2012.

(Continued)

*Primary Examiner* — Esaw T Abraham
(74) *Attorney, Agent, or Firm* — Liang & Cheng, PC

(57) ABSTRACT

A method includes receiving a write request for writing incoming data to a target memory line and, in response to the write request, comparing the incoming data with existing data in the target memory line to determine a number of a first type of state transition. The method further includes, in response to determining that the number of the first type of state transition for the write request exceeds a threshold, prior to writing the incoming data to the target memory line, storing adjacent data from each of a set of memory lines adjacent to the target memory line, and after writing the incoming data to the target memory line, writing the stored data to the set of adjacent memory lines.

20 Claims, 5 Drawing Sheets

(56) References Cited

OTHER PUBLICATIONS

L. Jiang, et al, "Mitigating Write Disturbance in Super-Dense Phase Change Memories," in DSN 2014.

P. Zhou, et al, "A durable and energy efficient main memory using phase change memory technology," in SIGARCH computer architecture news, 2009.

R. Wang, et al, "SD-PCM: Constructing reliable super dense pcm under write disturbance," In SIGARCH Computer Architecture News 2015.

S. Swami and K. Mohanram, "Adam: Architecture for write disturbance mitigation in scaled phase change memory," in DATE 2018.

U. Russo, et al, "Modeling of Programming and Read Performance in Phase-Change Memories", in IEEE Transactions on Electron Devices 2008.

\* cited by examiner

DEFENSE MECHANISM FOR NON-VOLATILE MEMORY BASED MAIN MEMORY

GOVERNMENT RIGHTS

This invention was made with Government support under PathForward Project with Lawrence Livermore National Security (Prime Contract No. DE-AC52-07NA27344, Subcontract No. B620717) awarded by DOE. The Government has certain rights in this invention.

BACKGROUND

The increasing prevalence of many-core systems and memory intensive workloads has resulted in an increase in the demand for high memory capacity. Technology scaling reduces the size and proximity of cells and packs more cells into a limited die area to achieve higher memory capacity. However, this trend jeopardizes current dynamic random access memory (DRAM) main memory designs, especially when scaling beyond 20 nanometer technology, because of fundamental obstacles related to high power consumption and process variation problems. Among several alternative technology candidates, Phase Change Memory (PCM) has desirable characteristics in terms of scalability, low access latency and negligible standby power.

A single PCM cell is programed by switching the chalcogenide material between a high resistance amorphous state (RESET) and a low resistance crystalline state (SET) through the application of a programming current. The cell in the SET state is changed to the RESET state by applying a high intense programming current to the cell that is considerably more than the current used for switching the cell from the RESET state to the SET state.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the scope of the embodiments.

In a phase change memory (PCM), transitioning a cell from the SET state to the RESET state is accomplished by applying a high programming current to the cell. This high programming current is substantially higher and generates more heat than the current used for transitioning a PCM cell from the RESET state to the SET state. The resetting of PCM cells produces heat that is capable of reducing the resistances of neighboring cells and thus disturb their contents, which potentially allows an attacker to intentionally reset cells and corrupt data that is not otherwise accessible to the attacker. In particular, the high inter-cell heat dissipation during programming increases the likelihood that errors will occur in deeply scaled PCM cells. While on-chip error correction codes are able to detect and correct a limited number of errors during normal operation, such error correction mechanisms are likely to fail when the number of errors dramatically increases due to deliberate malicious write attacks.

Figure 1A:
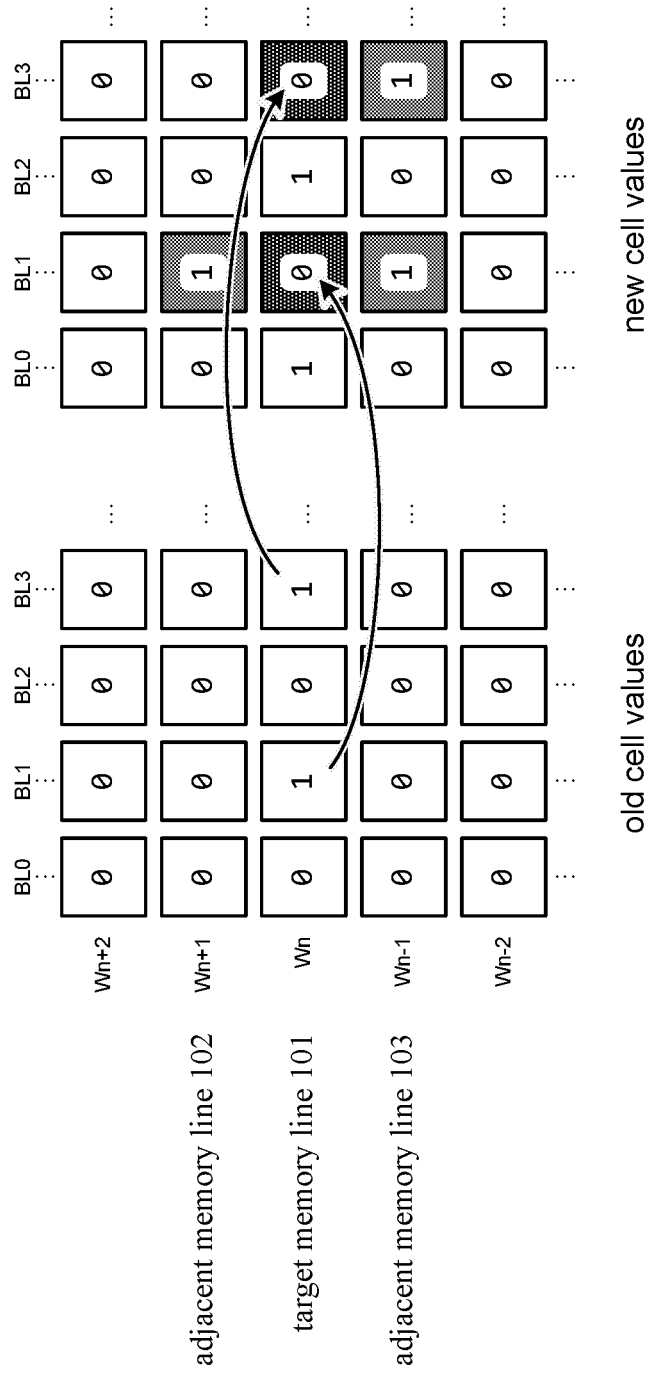
FIG. 1A illustrates write disturbance of adjacent memory cells, according to an embodiment.

FIG. 1A illustrates cell states in a PCM before and after reprogramming the memory line 'Wn', according to an embodiment. In particular, FIG. 1A illustrates the effects of programming the memory line Wn on five adjacent word-lines (Wn−2, Wn−1, Wn, Wn+1, Wn+2) and 4 bit-lines (BL0, BL1, BL2, BL3) of the PCM. The RESET state is represented as '0', and the SET state is represented as '1'. When programming the target memory line 101, the heat resulting from setting cells (Wn,BL0) and (Wn,BL2) from RESET to SET states during the programming process is negligible; however, the heat resulting from resetting cells (Wn,BL1) and (Wn,BL3) from SET to RESET states reduces the resistance of cells in word-lines 'Wn+1' and 'Wn−1' and disturbs cells (Wn+1,BL1), (Wn−1,BL1), and (Wn−1,BL3) in the adjacent memory lines 102-103. Since the programming heat reduces the resistance of cells, the state of cells changes from the RESET state to the SET state; thus, the write disturbance error is unidirectional. Due to the unidirectionality of the write disturbance error, the disturbed cells in 'Wn+1' and 'Wn−1' transitioning from RESET to SET do not disturb cells of the neighboring word-lines 'Wn+2' and 'Wn−2', respectively.

Figure 1B:
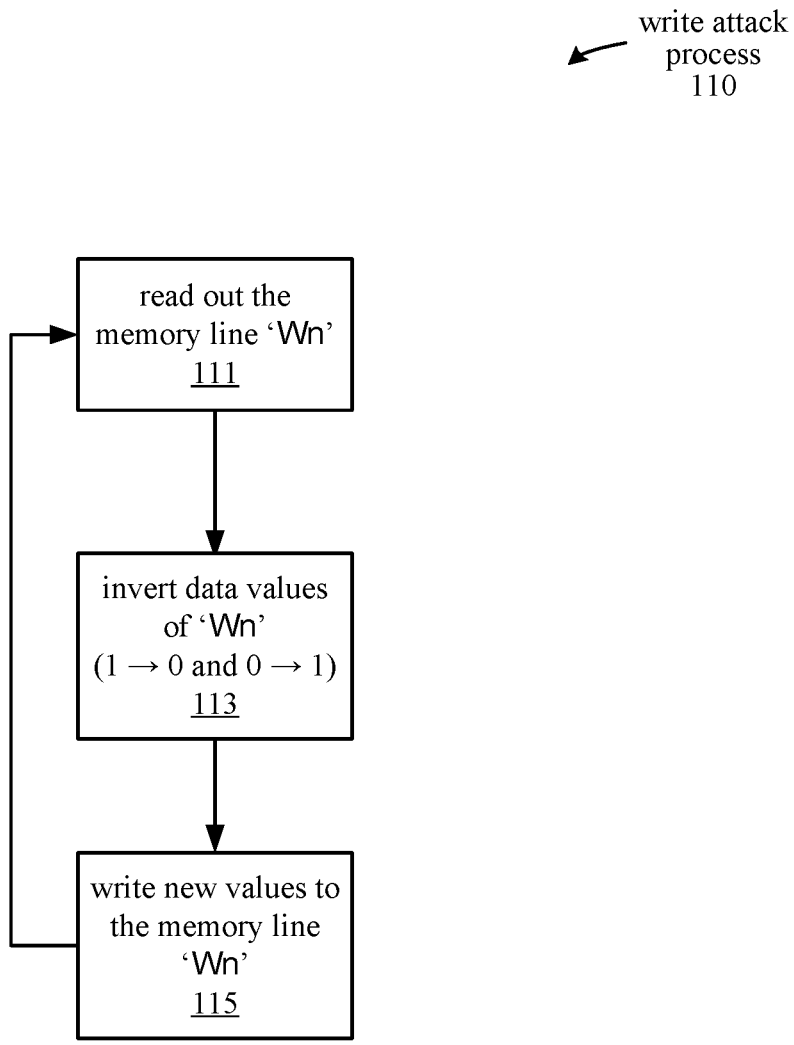
FIG. 1B illustrates a write attack process, according to an embodiment.

FIG. 1B illustrates a process 110 for executing a write attack on a PCM memory, according to an embodiment. The write attack process 110 is executed by a malicious program that calculates a specific pattern for writing to the target word line 101 to maximize the number of cells likely to be disturbed in the adjacent word lines 102-103. Specifically, updating cells of the target word line 101 with data patterns that impose many reset operations in the target word line 101 increases the likelihood that cells in the adjacent word-lines will be disturbed.

At block 111, the malicious program reads the existing data in the target memory line 101 'Wn'. New data for writing to the target memory line 101 is generated by inverting the data values of the existing data. This can be accomplished by performing a bitwise XOR operation of the existing data with the bit mask M='111 . . . 111'. In this case, each cell presently in the SET state switches to the RESET state in the new data and vice versa.

At block 115, the new data is written to the target memory line 101. Since each cell can be in either the '0' or the '1' state, repeating blocks 111-115 twice is sufficient to reset all cells in the target word-line at least once, without changing the final data in the target memory line 101 (since Wn=((Wn XOR M) XOR M). Because of the high write disturbance bit-line error rate, performing the write attack process 110 frequently imposes many errors in the adjacent victim word-lines. Since each of the victim word-lines has a limited error correction capability, the error correction code is not able to detect and correct all errors; thus, uncorrectable write disturbance errors persist in the victim word-lines.

In one embodiment, a memory system containing PCM or other memory technology that is susceptible to an attack such as the write attack process 110 performs a series of sequential writes after detecting that the number of uncorrectable errors likely to be caused by an incoming write operation exceeds the error correction capability of the memory. The defense mechanism protects PCM data blocks against malicious write operations while incurring low hardware overhead. In one embodiment, the defense mechanism compares incoming data to be written to a target word line with the existing data already stored in the target word line. If more than a threshold number of bits will be reset, then the data in any potential victim cells is stored prior to performing the write operation. After the write operation is performed, the previously stored values of the potential victim cells (e.g., the nearest adjacent cells of the target memory line) are written back to their original locations. This ensures that any bit errors that were introduced in the potential victim cells due to the write operation are subsequently overwritten with the correct data.

Figure 2:
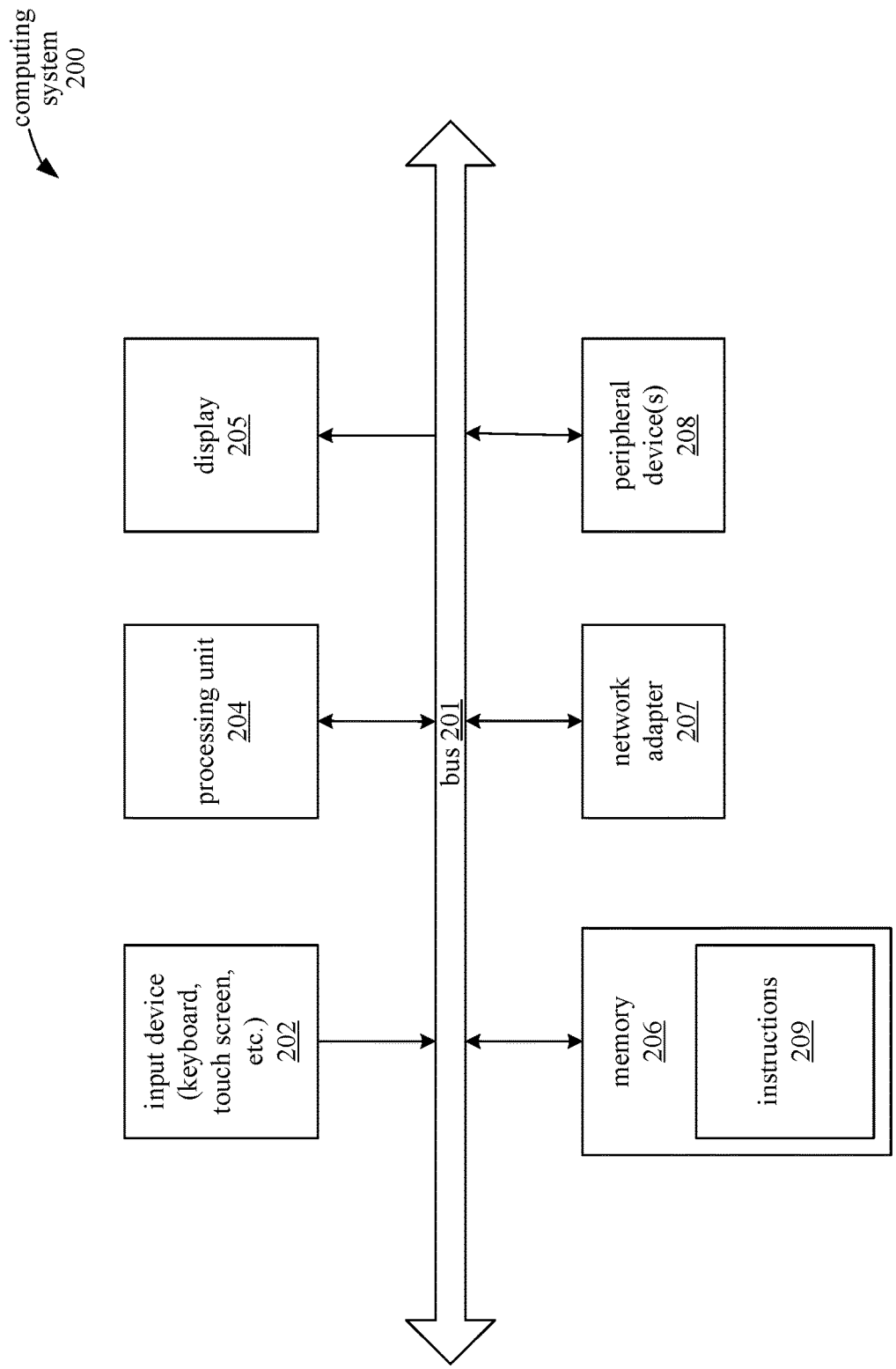
FIG. 2 illustrates a computing system, according to an embodiment.

FIG. 2 illustrates an embodiment of a computing system 200 in which the above write defense mechanism is implemented. In general, the computing system 200 is embodied as any of a number of different types of devices, including but not limited to a laptop or desktop computer, mobile device, server, network switch or router, etc. The computing system 200 includes a number of hardware resources, including components 202-208, which communicate with each other through a bus 201. In computing system 200, each of the components 202-208 is capable of communicating with any of the other components 202-208 either directly through the bus 201, or via one or more of the other components 202-208. The components 201-208 in computing system 200 are contained within a single physical enclosure, such as a laptop or desktop chassis, or a mobile phone casing. In alternative embodiments, some of the components of computing system 200 are embodied as external peripheral devices such that the entire computing system 200 does not reside within a single physical enclosure.

The computing system 200 also includes user interface devices for receiving information from or providing information to a user. Specifically, the computing system 200 includes an input device 202, such as a keyboard, mouse, touch-screen, or other device for receiving information from the user. The computing system 200 displays information to the user via a display 205, such as a monitor, light-emitting diode (LED) display, liquid crystal display, or other output device.

Computing system 200 additionally includes a network adapter 207 for transmitting and receiving data over a wired or wireless network. Computing system 200 also includes one or more peripheral devices 208. The peripheral devices 208 may include mass storage devices, location detection devices, sensors, input devices, or other types of devices used by the computing system 200. Memory system 206 includes memory devices used by the computing system 200, such as random-access memory (RAM) modules, read-only memory (ROM) modules, hard disks, and other non-transitory computer-readable media.

Computing system 200 includes a processing unit 204. In one embodiment, the processing unit 204 includes multiple processing cores that reside on a common integrated circuit substrate. The processing unit 204 receives and executes instructions 209 that are stored in a memory system 206. At least a portion of the instructions 209 defines an application including instructions that are executable by the processing unit 204.

Some embodiments of computing system 200 may include fewer or more components than the embodiment as illustrated in FIG. 2. For example, certain embodiments are implemented without any display 205 or input devices 202. Other embodiments have more than one of a particular component; for example, an embodiment of computing system 200 could have multiple processing units 204, buses 201, network adapters 207, memory systems 206, etc.

Figure 3:
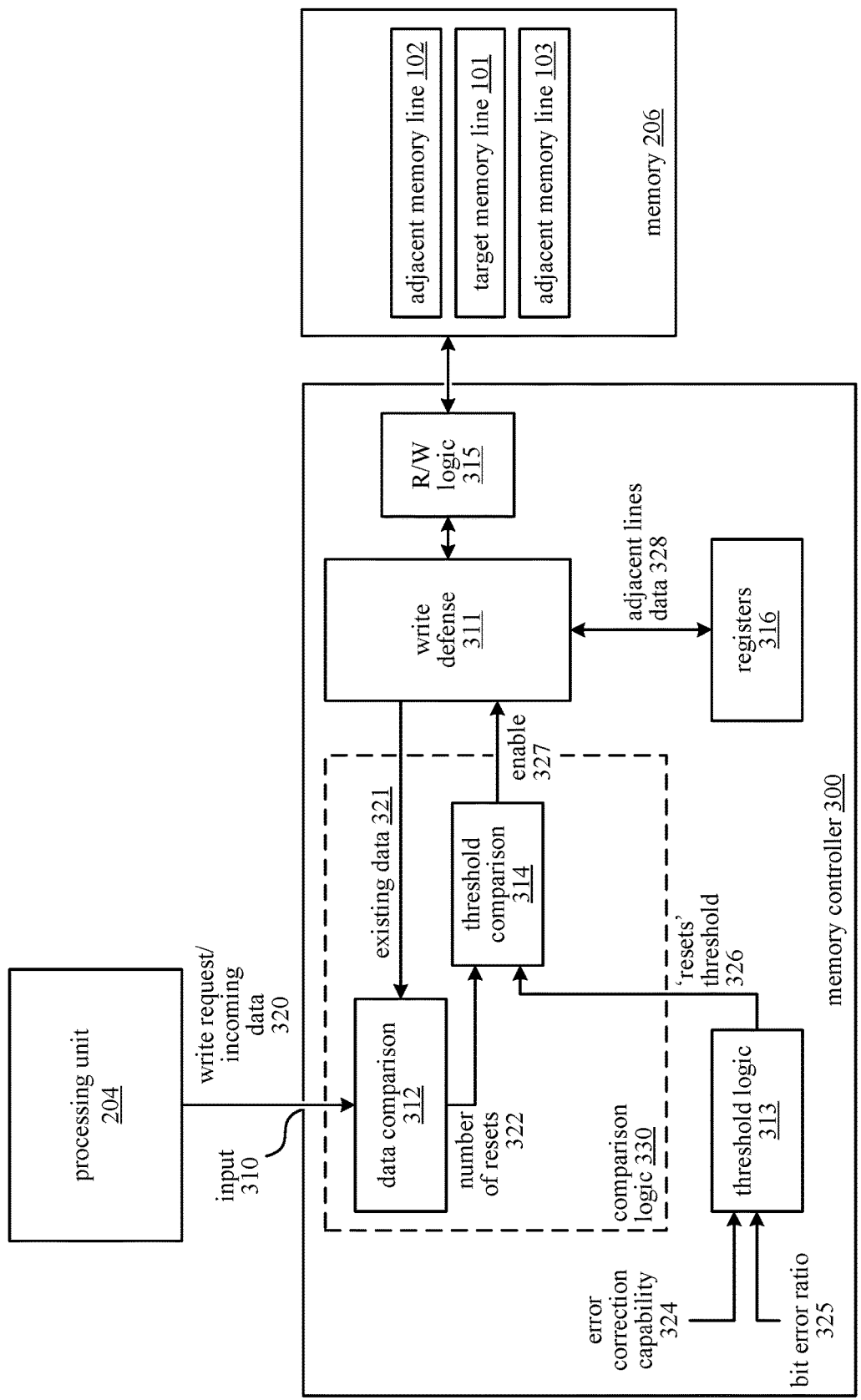
FIG. 3 illustrates a memory controller, according to an embodiment.

FIG. 3 illustrates components in the computing system 200, including a memory controller 300 that implements the write defense mechanism, according to an embodiment. In the computing system 200, the processing unit 204 accesses the physical main memory 206 by sending memory access requests to the memory controller 300 of the memory 206. Memory 206 includes PCM or another memory technology that is susceptible to the write attack process 110.

The memory controller 300 receives at its input port 310 a write request 320 from the processing unit 204. The write request 320 specifies incoming data to be written to the target memory line 101 in memory 206. The comparison logic 330 in the memory controller 300 includes a data comparison module 312 that, in response to the incoming write request 320, compares the incoming data 320 with the existing data 321 in the target memory line 101. The write defense module 311 reads the existing data 321 from the target memory line 101 via read/write logic 315, and the data 321 is compared with the incoming data 320 in the data comparison module 312 to determine the number 322 of memory cell state transitions that will be effected using a high programming current (e.g., a reset in PCM cells) in order to write the incoming data 320 to the target memory line 101 as requested.

In one embodiment, the target memory line 101 includes multi-level memory cells. In contrast to a single level cell having a resistance state that switches between high ('1') and low ('0'), the multi-level cell has multiple intermediate states. The write disturbance error rate of the multi-level cell PCM is much higher than that of the single level cell PCM. The programmed level of a multi-level cell is changed by performing a RESET of the cell, then programming the cell to the desired level. Thus, multi-level PCM cells are particularly susceptible to and can be highly disturbed by the write attack process 110. Accordingly, each multi-level cell that will undergo a change in its programming level in order to write the incoming data to the target memory line 101 is counted as a RESET by the write defense mechanism when determining the number of resets 322.

In the threshold comparison module 314, the number of resets 322 is compared to a threshold number of resets 326. The threshold number of resets 326 indicates the number of bit reset operations that, if performed when writing a memory line (e.g., 101), is likely to result in an uncorrectable number of bit errors in adjacent memory lines (e.g., 102-103). The threshold logic 313 calculates the threshold 326 based on the error correction capability 324 of the memory 206 and the bit error ratio 325. The error correction capability 324 represents a number of bit errors that are correctable by an error correction mechanism of the memory line. The bit error ratio is a proportion of bits that are in error for a given number of bits that are written (e.g., the number of bit errors divided by the total number of bits written). In one embodiment, the threshold 326 is a fixed value. In an alternative embodiment, the threshold logic 313 adjusts the threshold 326 dynamically during runtime based on changes in the error correction capability 324 and/or the bit error ratio 325.

For a given error correction capability E and a write bit error ratio BER, a value T for threshold 326 is calculated as T=E/BER. Accordingly, uncorrectable errors occur when the number of resets 322 times the bit error ratio 325 is greater than the error correction capability 324. In other words, when the number of reset operations R is greater than E/BER (or R×BER>E), the term 'R×BER' represents a number of write disturbance errors that exceeds the error correction capability of the memory 206, and uncorrectable errors occur.

When the number of resets 322 exceeds the threshold 326, the threshold comparison logic 314 enables 327 the write defense mechanism performed by the write defense module 311. When the write defense mechanism is enabled, the write defense module identifies a set of memory lines adjacent to the target memory line 101 in which uncorrectable errors are likely to occur. In one embodiment, the set of adjacent memory lines includes a memory line 102 that is physically located nearest to the target memory line 101 at a next higher address (e.g., Wn+1) than the target memory line 101 (e.g., at Wn), and a memory line 103 that is physically located nearest to the target memory line 101 at a next lower address (e.g., Wn−1) than the target memory line 101.

The write defense module 311 reads the existing data from the adjacent memory lines 102-103 via the read/write interface 315 before the requested write is performed in the target memory line 101, then stores the data 328 in a set of registers 316. In one embodiment, the registers 316 include two registers, with one register for storing the existing data from each of the adjacent memory lines 102-103. While the data 328 is illustrated as being stored in registers 316 residing in the memory controller 300, the data 328 can in alternative embodiments be stored in registers outside the memory controller 300 or in other types of memory elsewhere in the computing system 200.

After the data 328 from the adjacent lines 102-103 is saved, the read/write logic 315 writes the incoming data 320 to the target memory line 101 as requested. During the write process, the read/write logic 315 effects the state transitions for the appropriate bits in the target memory line 101 (i.e., the bits in the existing data that are different from the incoming data 320), which includes transitioning bits in the SET state to the RESET state, and can also include transitioning bits in the RESET state to the SET state. The read/write logic 315 transitions SET bits to the RESET state by applying a high programming current to the memory cell, potentially causing bit errors by changing the states of one or more bits in the adjacent memory lines 102-103.

After the incoming data 320 has been written to the target memory line 101, the write defense module 311 retrieves the previously stored data 328 of the adjacent lines 102-103 from the registers 316 and writes the data 328 back to their original locations in lines 102-103. Any bit errors in the adjacent memory lines 102-103 that were caused by the write process are overwritten at this stage, and the correct data remains in the memory lines 102-103.

Figure 4:
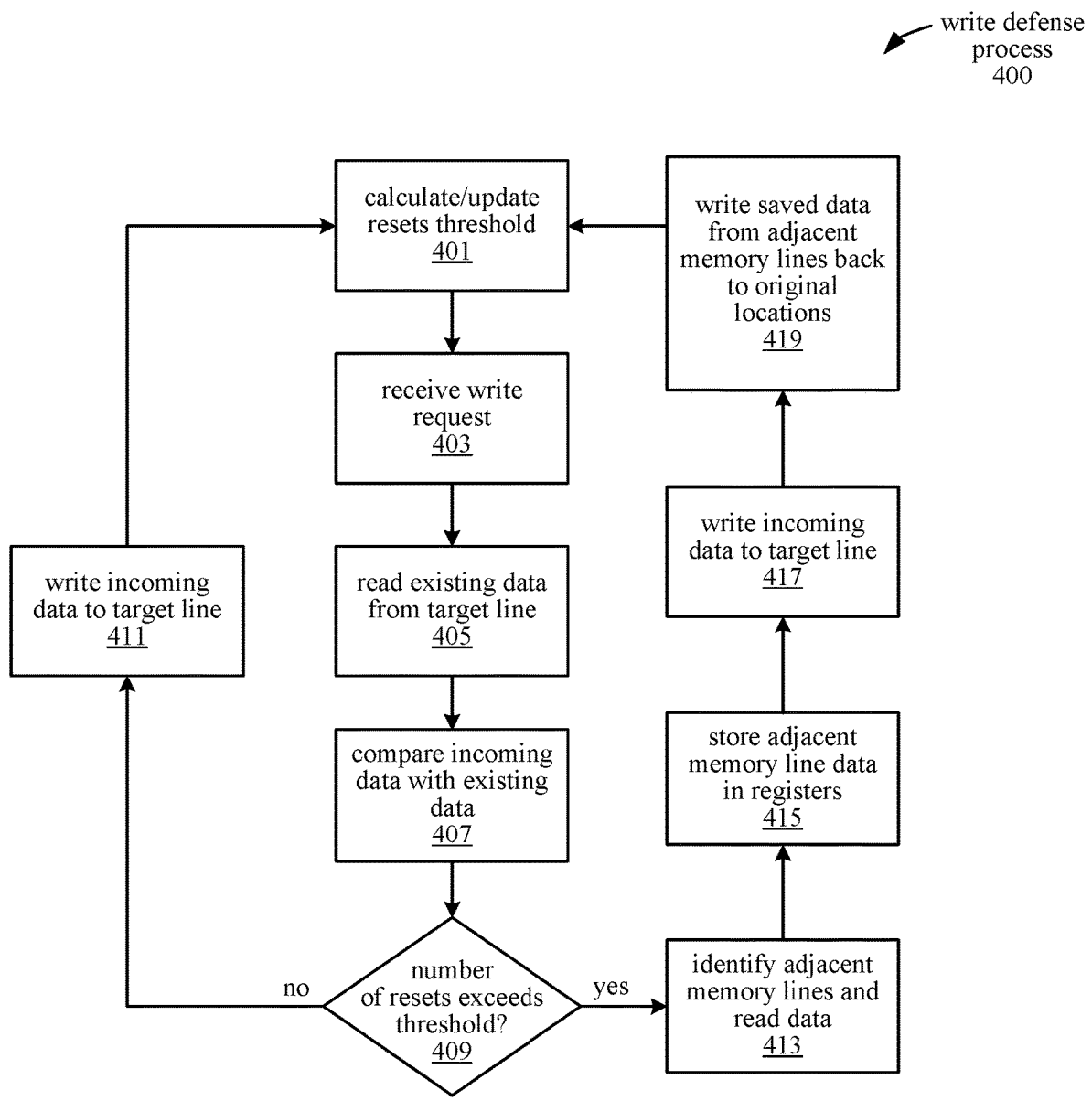
FIG. 4 is a flow diagram illustrating a write defense process, according to an embodiment.

FIG. 4 is a flow diagram illustrating a write defense process 400, according to an embodiment. The process 400 is performed by components of the computing system 200, such as the memory controller 300, memory 206, etc.

At block 401 of the process 400, the threshold logic 313 calculates the threshold number 326 of SET to RESET transitions that can be performed for each word line written in the memory 206 without causing an uncorrectable number of errors. The threshold 326 is calculated based on the error correction capability 324 of the memory 206 and the bit error ratio 325. In one embodiment, the threshold 326 is calculated as T=E/BER, where T is the threshold 326, E is the error correction capability 324, and BER is the bit error ratio (the fraction of bit transitions that will be incorrect for a given number of bit transitions effected). The threshold 326 is adjusted dynamically during runtime based on changes in either or both of the error correction capability 324 and the bit error ratio 325.

At block 403, the memory controller 300 receives a write request 320 from the processing unit 204. The write request 320 identifies the target memory line 101 and incoming data to be written to the memory line 101. The target memory line 101 resides in a PCM device, or another memory device that is susceptible to the write attack process 110.

At block 405, the write defense logic 311 responds to the write request 320 by invoking the read/write logic 315 to read the existing data 321 from the target memory line 101. At block 407, the data comparison logic 312 compares the existing data 321 with the incoming data 320 to determine the number of resets 322 (i.e., transitioning SET bits to RESET bits by applying a high programming current to a memory cell) that will be performed in order to write the incoming data 320 to the target memory line 101. In one embodiment, the data comparison logic 312 includes a counter that increments the number of resets 322 for each SET bit in the existing data 321 that will become a RESET bit in the incoming data. In one embodiment where the target memory line 101 includes multi-level memory cells, the data comparison logic 312 determines how many multi-level cells will undergo a change in level when the incoming data is written as the number of resets 322.

At block 409, the threshold comparison logic 314 compares the number of resets 322 with the threshold 326. If the number of resets 322 does not exceed the threshold 326, then the process 400 continues at block 411. At block 411, the read/write logic 315 writes the incoming data 320 to the target memory line 101. In this case, the write operation 411 performs sufficiently few bit resets that uncorrectable bit errors are unlikely to be induced in the adjacent memory lines 102-103. Thus, the write operation 411 proceeds without first saving the contents of the adjacent memory lines 102-103, in order to more quickly complete the requested write operation 411.

At block 409, if the number of resets 322 exceeds the threshold 326, then the threshold comparison logic 314 enables 327 saving of the adjacent memory line contents by the write defense mechanism. Accordingly, at block 413, the write defense module 311 identifies the memory lines 102-103 for reading that are adjacent to the target memory line 101. In one embodiment, the adjacent memory line 102 is the memory line that is physically located nearest to the target memory line 101 (Wn) at the next higher address (Wn+1), while the adjacent memory line 103 is physically located nearest to the target memory line 101 at the next lower address (Wn−1). The write defense module 311 invokes the read/write logic 315 to read the data 328 from the adjacent lines 102-103 and write the data 328 into the registers 316. In one embodiment, the registers 316 include two registers, and each of the lines 102-103 is stored in its own register.

After the contents of the adjacent memory lines 102-103 are saved, the incoming data 320 is written to the target line 101, as provided at block 417. In one embodiment, the write operation at block 417 saves energy and prolongs cell lifetime by writing only the subset of cells in the target memory line 101 storing bits that have changed, where the changed bits are identified upon comparing the incoming data 320 with the existing data 321 at the earlier block 407. Thus, for memory cells having changed bits, the read/write logic 315 effects either a SET to RESET bit transition by applying a high programming current to the memory cell or a RESET to SET bit transition by applying a relatively lower programming current to the memory cell. The write operation 417 performs a number of resets that is greater than the threshold 326, likely causing bit errors in the adjacent memory lines 102-103 due to the heat generated by the high programming current. Furthermore, the number of bit errors generated in the adjacent memory lines 102-103 is likely to exceed the error correction capability 324 of the memory 206's error correction codes or other error correction scheme.

However, any bit errors generated by the write operation 417 are overwritten with the saved original data of the adjacent memory lines 102-103 at block 419. The write defense module 311 retrieves the saved contents of the adjacent memory lines 102-103 from the registers 316 and writes the data back to their original locations. In one embodiment, only the bits in the adjacent memory lines 102-103 that are susceptible to bit errors (as determined based on identifying the bits being reset in the target memory line 101) are written back to the adjacent memory lines 102-103.

From block 419, the process 400 returns to block 401, at which the threshold logic 313 updates the threshold 326 in response to any changes in the error correction capability 324 and/or the bit error ratio 325. The process 400 thus repeats for each write request received at the memory controller 300, and for each write request, saves any potentially disturbed bits from the adjacent memory lines in order to automatically correct any bit errors arising from the requested write.

As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the computing system 200 and/or portions thereof carried on the computer-readable storage medium may be a database or other data structure which can be read by a program and used, directly or indirectly, to fabricate the hardware including the computing system 200. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates which also represent the functionality of the hardware including the computing system 200. The netlist may then be placed and routed to produce a data set describing geometric shapes to be applied to masks. The masks may then be used in various semiconductor fabrication steps to produce a semiconductor circuit or circuits corresponding to the computing system 200. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader scope of the embodiments as set forth in the appended claims. The specification and drawings are, accordingly, to be regarded in an illustrative sense rather than a restrictive sense.

What is claimed is:

1. A method, comprising:
   receiving a write request for writing incoming data to a target memory line;
   in response to the write request, comparing the incoming data with existing data in the target memory line to determine a number of a type of bit state transition; and
   in response to determining that the number of the type of bit state transition for the write request exceeds a threshold number of bit state transitions:
   prior to writing the incoming data to the target memory line, storing adjacent data from each of a set of memory lines adjacent to the target memory line, and
   after writing the incoming data to the target memory line, writing the stored data to the set of adjacent memory lines.

2. The method of claim 1, further comprising:
   calculating the threshold based on an error correction capability of the memory line and a write bit error ratio, wherein the error correction capability represents a number of bit errors that can be corrected by an error correction mechanism of the memory line.

3. The method of claim 2, further comprising:
   adjusting the threshold in response to a change in at least one of the error correction capability and the bit error ratio.

4. The method of claim 1, further comprising:
writing the incoming data to the target memory line by effecting the type of bit state transition in one or more bits in the target memory line, wherein:
the target memory line resides in a phase change memory, and
the type of bit state transition is a SET to RESET transition in the phase change memory effected by a higher programming current than a RESET to SET transition in the phase change memory.

5. The method of claim 1, wherein the set of memory lines adjacent to the target memory line comprises:
a first adjacent memory line physically located nearest to the target memory line at a higher address than the target memory line; and
a second adjacent memory line physically located nearest to the target memory line at a lower address than the target memory line.

6. The method of claim 1, wherein:
storing the adjacent data comprises writing the adjacent data into registers in a memory controller of a memory device containing the target memory line and the set of memory lines adjacent to the target memory line.

7. The method of claim 1, wherein:
the target memory line includes a set of multi-level memory cells; and
the number of the type of bit state transition represents a number of programming level changes in the set of multi-level memory cells for writing the incoming data to the target memory line.

8. The method of claim 1, further comprising:
in response to the write request, read the existing data from the target memory line prior to comparing the incoming data with the existing data:
writing the incoming data to the target memory line by:
identifying a subset of changed bits for writing in the memory line based on the comparing the incoming data with the existing data, and
writing the subset of changed bits in the memory line.

9. A controller device, comprising:
a comparison logic module configured to, in response to a write request for writing incoming data to a target memory line, compare the incoming data with existing data in the target memory line to determine a number of a type of bit state transition; and
a write defense module coupled with the comparison logic and configured to, in response to determining that the number of the type of bit state transition for the write request exceeds a threshold number of bit state transitions:
prior to writing the incoming data to the target memory line, store adjacent data from each of a set of memory lines adjacent to the target memory line, and
after writing the incoming data to the target memory line, write the stored data to the set of adjacent memory lines.

10. The controller device of claim 9, further comprising:
a threshold module coupled with the comparison logic module and configured to calculate the threshold based on an error correction capability of the memory line and a write bit error ratio, wherein the error correction capability represents a number of bit errors that can be corrected by an error correction mechanism of the memory line.

11. The controller device of claim 10, wherein the threshold module is further configured to:
adjust the threshold based on a change in at least one of the error correction capability and the bit error ratio.

12. The controller device of claim 9, further comprising:
a set of registers coupled with the write defense module and configured to store the adjacent data, wherein the set of registers resides in a memory controller of a memory device containing the target memory line and the set of memory lines adjacent to the target memory line.

13. The controller device of claim 9, further comprising a read/write logic module coupled with the write defense module and configured to:
in response to the write request, read the existing data from the target memory line prior to the comparing the incoming data with the existing data; and
write the incoming data to the target memory line by:
identifying a subset of changed bits for writing in the memory line based on the comparing the incoming data with the existing data, and
writing the subset of changed bits to the memory line.

14. The controller device of claim 9, further comprising a read/write logic module coupled with the write defense module and configured to:
write the incoming data to the target memory line by effecting the type of bit state transition in one or more bits in the target memory line, wherein:
the target memory line resides in a phase change memory, and
the type of bit state transition is a SET to RESET transition in the phase change memory effected by a higher programming current than a RESET to SET transition in the phase change memory.

15. A system, comprising:
a processing unit;
a memory device; and
a controller device coupled with the memory device and the processing unit, the controller device comprising:
a comparison logic module configured to, in response to a write request for writing incoming data to a target memory line, comparing the incoming data with existing data in the target memory line to determine a number of a type of bit state transition, and
a write defense module coupled with the comparison logic and configured to, in response to determining that the number of the type of bit state transition for the write request exceeds a threshold number of bit state transitions:
prior to writing the incoming data to the target memory line, storing adjacent data from each of a set of memory lines adjacent to the target memory line in the memory device, and
after writing the incoming data to the target memory line, writing the stored data to the set of adjacent memory lines.

16. The system of claim 15, wherein:
the memory device comprises a set of phase change memory cells;
the controller device is further configured to write the incoming data to the target memory line by effecting the type of bit state transition in one or more bits in the target memory line:
the type of bit state transition is a SET to RESET transition in the phase change memory cells effected by a higher programming current than a RESET to SET transition in the phase change memory.

17. The system of claim 15, wherein the set of memory lines adjacent to the target memory line comprises:
- a first adjacent memory line physically located nearest to the target memory line at a higher address than the target memory line; and
- a second adjacent memory line physically located nearest to the target memory line at a lower address than the target memory line.

18. The system of claim 15, wherein:
- the target memory line includes a set of multi-level memory cells in the memory device; and
- the number of the type of bit state transition represents a number of programming level changes in the set of multi-level memory cells for writing the incoming data to the target memory line.

19. The system of claim 15, wherein:
- the controller device is further configured to store the adjacent data by copying the adjacent data from the adjacent memory lines to a set of registers in the controller device.

20. The system of claim 15, wherein the controller device is further configured to:
- in response to the write request, read the existing data from the target memory line prior to comparing the incoming data with the existing data; and
- write the incoming data to the target memory line by:
  - identifying a subset of changed bits for writing in the memory line based on the comparing the incoming data with the existing data, and
  - writing the subset of changed bits in the memory line.

* * * * *